(12) United States Patent
Podkolzin et al.

(10) Patent No.: US 8,977,939 B2
(45) Date of Patent: Mar. 10, 2015

(54) MAJORITY-TABULAR POST PROCESSING OF QUASI-CYCLIC LOW-DENSITY PARITY-CHECK CODES

(71) Applicant: LSI Corporation, Milpitas, CA (US)

(72) Inventors: Alexander S. Podkolzin, Moscow (RU); Shaohua Yang, San Jose, CA (US); Lav D. Ivanovic, Sunnyvale, CA (US); Sergey Afonin, Moscow (RU)

(73) Assignee: LSI Corporation, San Jose, CA (US)

( * ) Notice: Subject to any disclaimer, the term of this patent is extended or adjusted under 35 U.S.C. 154(b) by 200 days.

(21) Appl. No.: 13/723,357

(22) Filed: Dec. 21, 2012

(65) Prior Publication Data

US 2014/0181624 A1 Jun. 26, 2014

(51) Int. Cl.
*H03M 13/00* (2006.01)
*H03M 13/11* (2006.01)

(52) U.S. Cl.
CPC .................. *H03M 13/1142* (2013.01)
USPC .......................................................... 714/785

(58) Field of Classification Search
CPC ............ H03M 13/1128; H03M 13/1142; H03M 13/116; H03M 13/451; H03M 13/458; H03M 13/1111; H03M 13/3707; H03M 13/3753; H03M 13/3738; H03M 13/09
See application file for complete search history.

(56) References Cited

U.S. PATENT DOCUMENTS

| | | | | |
|---|---|---|---|---|
| 8,127,209 B1 * | 2/2012 | Zhang et al. | | 714/780 |
| 8,196,016 B1 * | 6/2012 | Langner et al. | | 714/758 |
| 8,347,195 B1 * | 1/2013 | Varnica et al. | | 714/785 |
| 8,601,328 B1 * | 12/2013 | Varnica et al. | | 714/714 |
| 8,799,742 B1 * | 8/2014 | Zhang et al. | | 714/759 |
| 2010/0042897 A1 * | 2/2010 | Han et al. | | 714/752 |
| 2010/0042906 A1 * | 2/2010 | Gunnam et al. | | 714/780 |
| 2011/0138253 A1 * | 6/2011 | Gunnam | | 714/773 |
| 2012/0005552 A1 | 1/2012 | Gunnam | | |

OTHER PUBLICATIONS

Chih-Chun Wang, Sanjeev R. Kulkarni, H. Vincent Poor—Finding All Small Error-Prone Substructures in LDPC Codes—May 2009, vol. 55, No. 5.*
Karimi, Mendi, et al., "An Efficient Algorithm for Finding Dominant Trapping Sets of LDPC Codes"; IEEE, Apr. 13, 2012, 36 pages.

* cited by examiner

*Primary Examiner* — Guerrier Merant
(74) *Attorney, Agent, or Firm* — Suiter Swantz pc llo

(57) ABSTRACT

A method for finding a valid codeword based on a near codeword trapping in a low-density parity-check decoding process includes identifying trapping set configurations and applying corrections to produce trapping sets with a limited number of invalid checks. Trapping set configurations are corrected in order to produce a trapping set in a table of trapping sets, the table associating each corrected trapping set with a valid codeword.

20 Claims, 4 Drawing Sheets

MAJORITY-TABULAR POST PROCESSING OF QUASI-CYCLIC LOW-DENSITY PARITY-CHECK CODES

BACKGROUND OF THE INVENTION

During belief propagation low-density parity-check decoding, trapping sets (messages that are close to codewords but that cannot be decoded by a decoder) could appear. It is possible to enumerate all trapping sets of a given code, and for each trapping set compute distortions which each trapping set introduces to a message.

It is possible to enumerate all trapping sets violating only one or two parity check constraints because the number of such trapping sets is limited. However, the number of trapping sets rapidly grows as the number of violated constraints increases (i.e. size of a trapping set) and such listing technique cannot be directly applied if the number of violated constraints is relatively high (greater than three).

Consequently, it would be advantageous if an apparatus existed that is suitable for post-processing a low-density parity-check encoded message to provide a valid codeword in all cases.

SUMMARY OF THE INVENTION

Accordingly, the present invention is directed to a novel method and apparatus for post-processing a low-density parity-check encoded message to provide a valid codeword in all cases.

In at least one embodiment of the present invention, trapping sets for a low-density parity-check code are tabulated by identifying discreet portions of a trapping set having characteristics conducive to corrective transformation. Corrections to one or more such discreet portions are produced and recorded in a table.

In another embodiment of the present invention, a trapping set in a low-density parity-check code is decoded by identifying one or more discreet portions of a near codeword having characteristics conducive to corrective transformation and applying at least one correction to at least one of those discreet portions.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the subject matter disclosed, which is illustrated in the accompanying drawings. The scope of the invention is limited only by the claims; numerous alternatives, modifications and equivalents are encompassed. For the purpose of clarity, technical material that is known in the technical fields related to the embodiments has not been described in detail to avoid unnecessarily obscuring the description.

In the context of the present application, vertices of a trapping set should be understood to mean all vertices that appear in violated check constraints whether or not they are assigned a non-zero value. A graph of a trapping set is a graph in which vertices are vertices of the trapping set and two or more vertices are connected by an edge if the vertices belong to one check constraint. Edge value means the value of a check constraint. A check constraint is valid if it has zero value. A message is called a near codeword if all but a few constraints are valid. A syndrome of a message is the list of all violated constraints.

Figure 1:
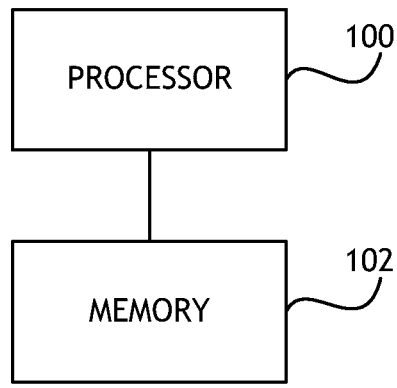
FIG. 1 shows a block diagram of a system useful for implementing embodiments of the present invention.

Referring to FIG. 1, a block diagram of a system useful for implementing embodiments of the present invention is shown. The computing device includes a processor 100 connected to a memory 102. The processor 100 is configured to execute computer executable program code to implement methods according to embodiments of the present invention. The memory 102 is configured to store computer executable program code to implement methods according to embodiments of the present invention and to store output of embodiments of the present invention in appropriate data structures.

Figure 2:
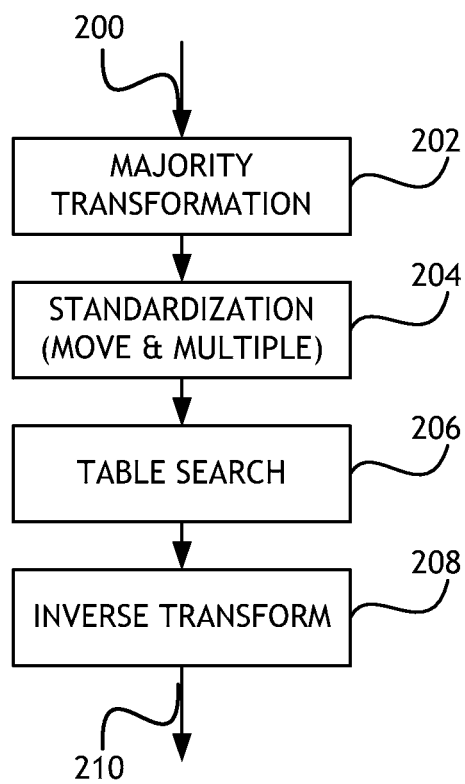
FIG. 2 shows a flowchart of a method for post-processing.

Referring to FIG. 2, a flowchart of a method for post-processing is shown. Post-processing is a decoding technique to decode an input message when belief propagation decoding produces a trapping set. The process includes receiving a near codeword 200 as an input. The near codeword 200 may have two to seven violated parity check constraints that appear after a belief propagation hard decision. The near codeword 200 corresponds to a syndrome of the violated parity check constraints.

In a post-processing procedure, the near codeword 200 undergoes a majority transformation 202. A majority transformation 202 reduces the number of non-zero elements of the syndrome corresponding to the near codeword 200 as described more fully herein.

In at least one embodiment of the present invention, after the majority transformation 202, the transformed near codeword is normalized 204. Normalization 204 produces a new vector and a corresponding new syndrome based on the near codeword. One advantage of this embodiment is that subsequent processing of the new vector and new syndrome is simplified due to the reduced number of non-zero elements in the new syndrome.

A particular low-density parity-check code could be associated with a table or other data structure of all possible (or most important) trapping sets and a corresponding correction for each trapping set that is applied to a near codeword to produce a valid codeword. The trapping set table may be constructed by experimental research of specific low-density parity-check matrices and decoding algorithms. Each syndrome listed in a table of trapping sets admits identification of a trapping set if its graph structure is isomorphic to the graph of some basic trapping set. During post-processing, the trapping set table is searched 206 based on the normalized, new vector and the normalized new syndrome. Once a correction is identified from a trapping set table, the correction is applied to the normalized, new vector.

Finally, an inverse transformation 208 is applied to the corrected, normalized, new vector. An inverse transformation converts the corrected, normalized, new vector into a valid codeword 210 corresponding to the original near codeword.

Figure 3:
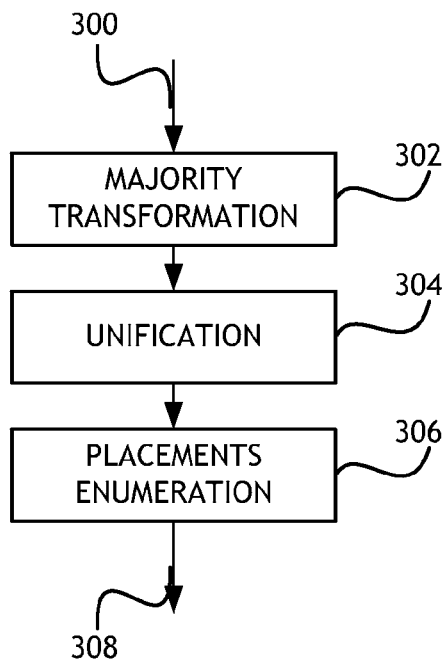
FIG. 3 shows a flowchart of a method for tabulating trapping sets.

Referring to FIG. 3, a flowchart of a method for tabulating trapping sets is shown. Where the number of non-zero edges in a trapping set 300 is greater than three, one or more majority transformations 302 are applied to reduce the number of non-zero edges. Majority transformations 302 produce a modified trapping set with a smaller number of edges and the same number or fewer vertices.

A trapping set, including a trapping set that is a product of a majority transformation 302, then undergoes unification 304 Unification 304 includes translation or parallel shift of the trapping set according to the layout of a tanner graph and proportional changes the vertex values of the trapping set as described more fully herein. During unification 304, two non-zero edges of a trapping set are fixed. Unification 304 reduces the number of trapping sets placed in a trapping set table.

When two non-zero edges in a trapping set are fixed, all other possible placements for remaining vertices and edges can be enumerated 306. When all other possible placements for remaining vertices and edges are enumerated 306, the resulting syndromes 308 are placed in a trapping set table. One potential advantage of this embodiment is that the number of trapping sets in the trapping set table is reduced. Alternatively, trapping sets corresponding to near codewords with more than four violated constraints are stored in the trapping set table.

Majority transformation is defined as a function of vertices and edges in a near codeword or trapping set. Examples of several configurations of vertices and edges will now be discussed in detail.

Figure 4:
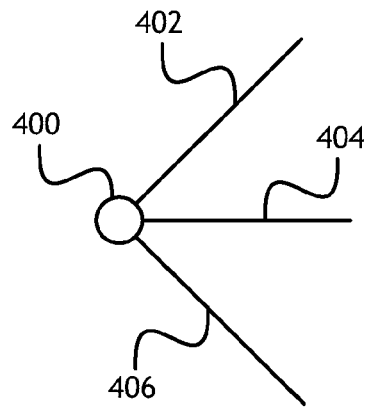
FIG. 4 shows a block diagram of a vertex and three edges, subject to correction during transformation.

Referring to FIG. 4, a block diagram of a vertex and three edges, subject to correction during transformation is shown. Where three non-zero edges 402, 404, 406 are incident to one vertex 400, there may be a correction to the value of the vertex 400 such that all three edges 402, 404, 406 are a zero value. If such a correction exists, it is applied.

Figure 5:
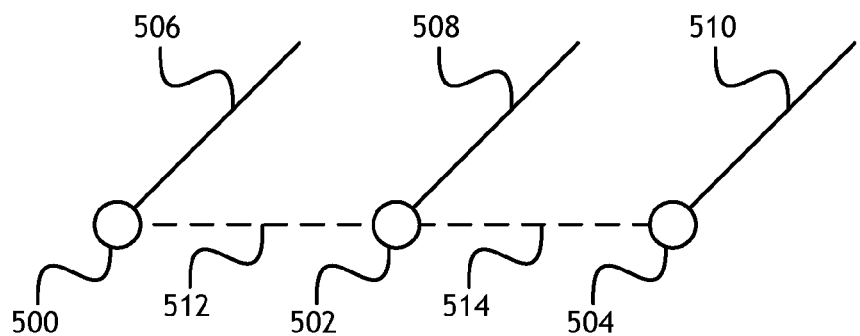
FIG. 5 shows a block diagram of three vertices, each having two edges, subject to correction during transformation.

Referring to FIG. 5, a block diagram of three vertices, each having two edges, subject to correction during transformation is shown. Where three vertices 500, 502, 504 are connected in a chain such that a first vertex 500 is connected to a second vertex 502 by a first connecting edge 512 and the second vertex 502 is connected to a third vertex 504 by a second connecting edge 514, and each of the three vertices 500, 502, 504 is connected to a non-zero edge 506, 508, 510, there may be a correction to the three vertices 500, 502, 504 such that all of the edges 506, 508, 510, 512, 514 are a zero value. If such a correction exists, it is applied.

Figure 6:
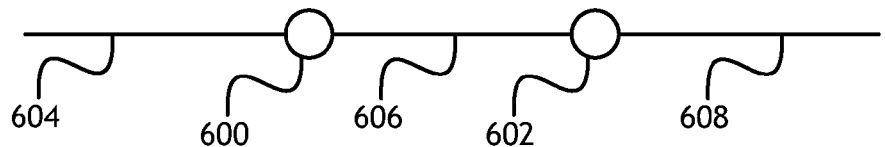
FIG. 6 shows a block diagram of two vertices and three edges, subject to correction during transformation.

Referring to FIG. 6, a block diagram of two vertices and three edges, subject to correction during transformation is shown. Where two vertices 600, 602 are connected in a chain such that a first non-zero edge 604 is connected to a first vertex 600, the first vertex 600 is connected to a second vertex 602 by a non-zero connecting edge 606 and the second edge 602 is connected to a second non-zero edge 608, there may be a correction to the two vertices 600, 602 such that all of the edges 604, 606, 608 are a zero value. If such a correction exists, it is applied.

Figure 7:
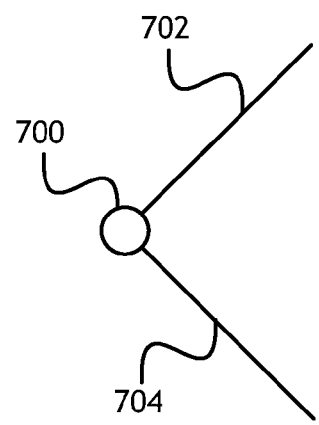
FIG. 7 shows a block diagram of a vertex and two edges, subject to correction during transformation.

Referring to FIG. 7, a block diagram of a vertex and two edges, subject to correction during transformation is shown. Where two non-zero edges 702, 704 are incident to one vertex 700, there may be a correction to the value of the vertex 400 such that all two edges 702, 704 are a zero value. If such a correction exists, it is applied.

If a trapping set has four or more non-zero edges, transformations are applied according to a set of priority rules. Transformations are applied in order of a hierarchy depending on the available corrections. For example, if a trapping set configuration includes a vertex connected to three non-zero edges where a correction to the vertex exists such that the edges are a zero value, such as in FIG. 4, that correction is applied regardless of other possible corrections. If such correction does not exist, and if the trapping set includes three vertices connected in a chain where each vertex is further connected to a non-zero edge and a correction to the three vertices exists such that all edges are a zero value, such as in FIG. 5, that correction is applied regardless of other possible corrections. If such correction does not exist, and if the trapping set includes two vertices connected by a non-zero edge, each vertex further independently connected to another non-zero edge and a correction to the two vertices exists such that all edges are a zero value, such as in FIG. 6, that correction is applied regardless of other possible corrections. If such correction does not exist, and if the trapping set includes a vertex connected to two non-zero edges where a correction to the vertex exists such that the edges are a zero value such as in FIG. 7, that correction is applied.

In some embodiments of the present invention, more than one correction is applied. For example, if a trapping set configuration includes a vertex connected to three non-zero edges where a correction to the vertex exists such that the edges are a zero value, such as in FIG. 4, that correction is applied. Then, if the trapping set includes three vertices connected in a chain where each vertex is further connected to a non-zero edge and a correction to the three vertices exists such that all edges are a zero value, such as in FIG. 5, that correction is applied.

In some embodiments of the present invention, more than one of the same type of correction is available; for example, a trapping set configuration including two vertices, each connected to three non-zero edges, where a correction to each vertex exists such that the edges connected to that vertex are a zero value. In that case, one of the possible corrections is chosen at random and applied.

Figure 8:
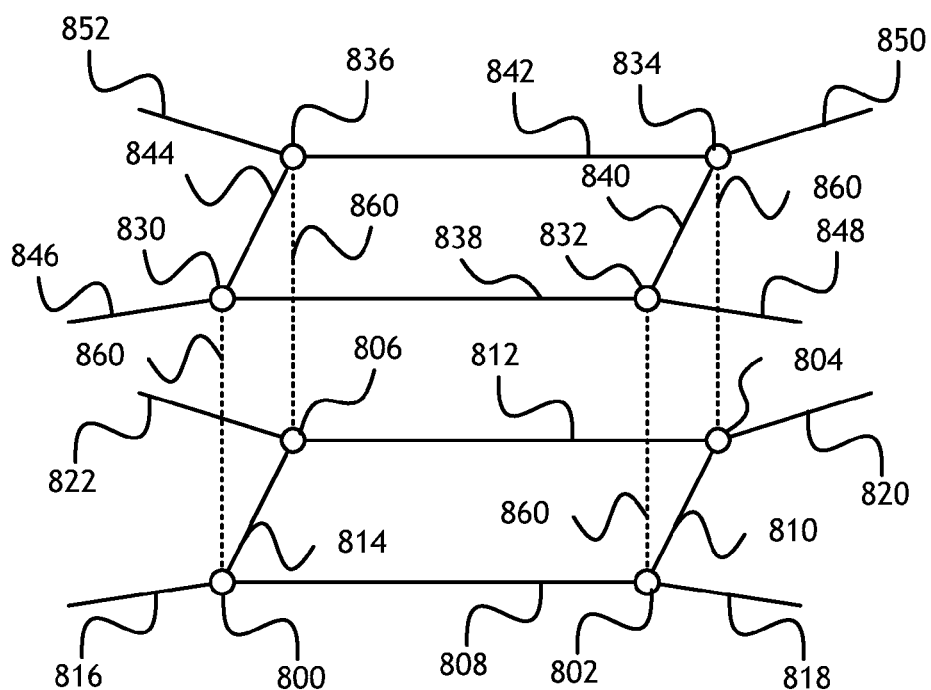
FIG. 8 shows an isometric representation of a translation.

Referring to FIG. 8, an isometric representation of a translation is shown. In some embodiments of the present invention, unification, such as described in FIG. 3, includes translation or parallel shift of the trapping set according to the layout of a tanner graph and proportional changes the vertex 800, 802, 804, 806 values of the trapping set. Trapping set translation is a simultaneous cyclic rotation of rows and columns of the parity-check matrix that is consistent with the parity-check matrix's quasi-cyclic structure. Quasi-cyclic low-density parity-check matrixes are block-lines of M-by-M squares, where each square is a cyclic shift of a unit matrix of size M.

A vertex 800, 802, 804, 806 with would have a value of N where $N=M*n+m$, $m<=M$, and k is an integer such that $0<=k<=M-1$. Mapping N onto $M*n+((m+k) \bmod M)$ produces a vertex shift by a shift distance 860. Similarly, if N is a number of a matrix row, then a row shift by the shift distance 860 is defined by $M*n+((m+k) \bmod M)$. Shift transformation keeps edges 808, 810, 812, 814, 816, 818, 820, 822 and vertices 800, 802, 804, 806 in the same M-by-M square producing shifted vertices 830, 832, 834, 836 and shifter edges 838, 840, 842, 844, 846, 848, 850, 852. The simultaneous shift of all rows and columns by a shift distance 860 preserves incidence relationships. Moreover, as a shift does not cross M-by-M square boundaries, each vertex's 800, 802, 804, 806 weight remains unchanged after transformation.

In a trapping set with a non-zero basis edge (for example, a first edge 808), the non-zero basis edge 808 belongs to one of an L block-lines of code's parity-check matrix. Using translation techniques, the non-zero basis edge 808 is transformed into a transformed non-zero basis edge 838 which belongs to a first row of the parity-check matrix's block-line. Then, the value of the transformed non-zero basis edge 838 is transformed into one by multiplication of all the trapping set's vertices 800, 802, 804, 806 by a corresponding coefficient. The transformed trapping set is then recorded in a trapping set table. One advantage of this embodiment is that only trapping sets with non-zero basis edges having number 0, M, . . . , M(L−1) and value 1 need to be recorded.

Trapping set placement in a tanner graph is determined by correspondence between vertices 800, 802, 804, 806 and the collection of non-zero vertices 800, 802, 804, 806 that make non-zero edges 808, 810, 812, 814, 816, 818, 820, 822 valid. Only unified trapping set configurations are enumerated.

Trapping sets stored in a trapping set table are defined by a non-zero basis edge and a non-zero directing edge which is the second non-zero edge in the trapping set. Each trapping set placement is associated with the number of the code block-line which contains the non-zero basis edge, the number of the code block-line which contains the non-zero directing edge, the number of the row in a block-line which contains the non-zero directing edge, the non-zero value of the non-zero directing edge, a list of pairs each including the number and value of a remaining trapping set edge sorted in increasing order of edge number, and a list of pairs each including the number and distortion of a trapping set vertex.

In some embodiments of the present invention, the data is distributed over more than one trapping set table, with each trapping set table having indexes equal to the number of non-zero edges in the trapping sets stored in the trapping set tables.

Figure 9:
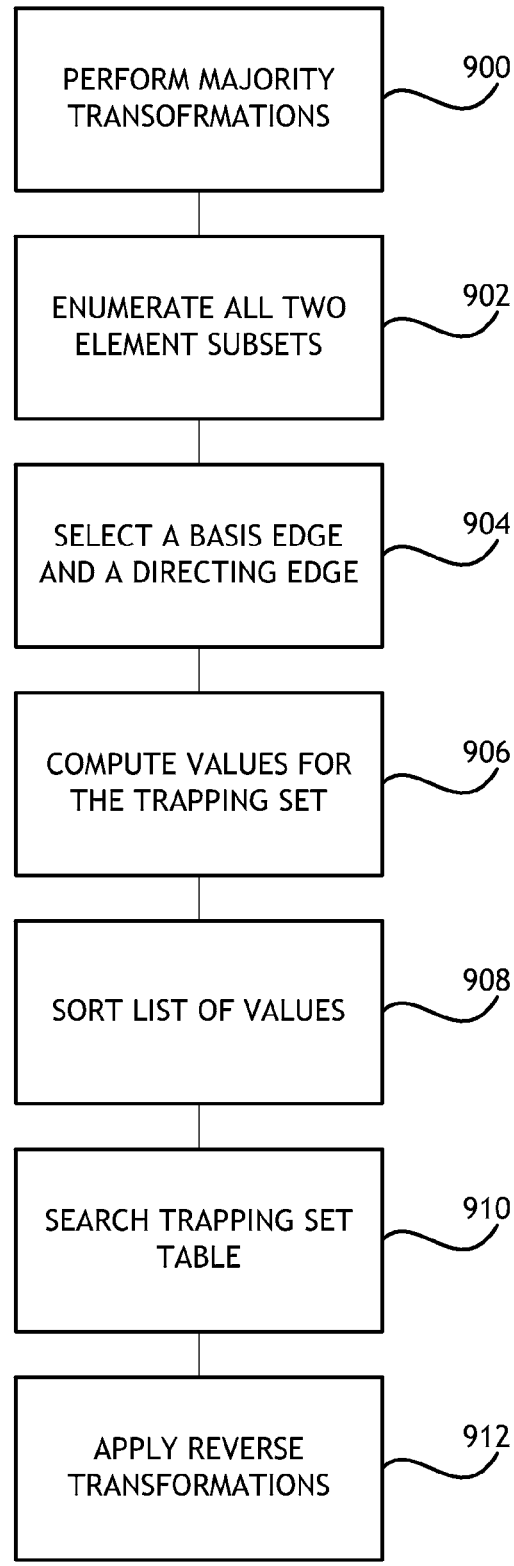
FIG. 9 show a flowchart of a method for decoding a codeword having four or more violated constraints.

Referring to FIG. 9, a flowchart of a method for decoding a codeword having four or more violated constraints is shown. During decoding of a near codeword and corresponding syndrome, if the number of non-zero edges in the syndrome is less than four, the original near codeword is used in subsequent decoding steps. However, in at least one embodiment of the present invention, if the number of non-zero edges in the syndrome is greater than or equal to four, majority transformations are applied 900 to the near codeword. Majority transformations are applied according to the priority rules set used to construct the corresponding trapping set table.

For example, where a near codeword contains a trapping set four or more non-zero edges. Vertices of this trapping set are not known but edges are in a syndrome. If the trapping set was tabulated, it could appear in a trapping set table in unified form. The same transformations used to produce the unified trapping set table are then applied to the near codeword. In contrast to the majority transformations during tabulation, at the decoding stage all possible transformation sequences are checked. Transformations are applied in accordance with the priority rules described herein. A brute-force search is conducted so all single transformations precede sequences of two successive transformations. If a transformation yields a transformed near codeword with up to four non-zero edges in its syndrome, then the transformed near codeword and syndrome are decoded by reference to a trapping set table.

In at least one embodiment of the present invention, one the majority transformations are complete, all two-element subsets of the resulting syndrome are enumerated 902. Each enumerated two-element subset comprises a basis edge and a directing edge.

A basis edge and directing edge are selected 904 from the set of two-element subsets and values are computed 906 for the basis edge and directing edge to find a trapping set distortion value. In at least one embodiment of the present invention, values are computed as follows: The basis edge is translated by a basis edge translation value to place the basis edge in the first line of a corresponding block-line. The basis edge translation value is a function of the number of the basis edge. Based on the basis edge translation value, the block-line of the basis edge is computed. A normalization coefficient is computed by dividing one by the basis edge.

The directing edge is then translated by the basis edge translation value to produce a translated directing edge value. Based on the translated directing edge values, a first directing edge divisor value and second directing edge divisor value is found. A normalization value for the directing edge is then computed by multiplying the directing edge by the normalization coefficient.

The block line of the basis edge, first directing edge divisor value, second directing edge divisor value, and normalization coefficient constitute a tuple.

The remaining edges in the syndrome are then normalized and translated by the basis edge translation value. The results are then sorted 908 and the trapping set table is searched 910.

In at least one embodiment of the present invention, trapping sets are organized into one or more tables. Based on the block line of the basis edge, first directing edge divisor value, second directing edge divisor value, and normalization coefficient constitute, the appropriate data element in the one or more tables is identified. Each data element stores corrections that are applied to near codewords to transform it into a codeword.

In at least one embodiment of the present invention, each data element includes one or more corrections associated with one or more trapping sets having four or more violated check nodes. The appropriate data element and correction is identified based on a formula including the block line of the basis edge, first directing edge divisor value, second directing edge divisor value, and normalization coefficient. Where the formula indicates a data element having more than one applicable correction, all of the corrections are selected.

Corrections are then applied 912 by reverse transformation. A decoder receives a set of vertices and corresponding corrections to the vertices. A set of values is computer by translating each vertex in the set of vertices and corresponding corrections by the block line of the basis edge and dividing each corresponding correction by the normalization coefficient. Each value in the near codeword at an index corresponding to each translated vertex is then corrected by adding the corresponding normalized correction value. The result is a codeword.

It is believed that the present invention and many of its attendant advantages will be understood by the foregoing description of particular embodiments, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method comprising:
   identifying a portion of a low-density parity-check trapping set syndrome;
   performing a majority transformation to reduce the number of non-zero elements of the syndrome;
   producing a correction to the identified portion of the low-density parity-check trapping set syndrome based on the majority transformation;
   recording the correction in a data structure configured to associate the correction with the trapping set such that the correction is identifiable for any future instances of the trapping set syndrome,
   wherein the correction is configured to remove one or more unsatisfied check nodes from the low-density parity-check trapping set syndrome.

2. The method of claim 1, wherein the portion of the low-density parity-check trapping set syndrome comprises one vertex connected to three non-zero edges.

3. The method of claim 1, wherein:
   the portion of the low-density parity-check trapping set syndrome comprises three vertices;
   each of the three vertices connected to one non-zero edge;
   a first vertex of the three vertices is connected to a second vertex of the three vertices by a first connecting edge; and
   a third vertex of the three vertices is connected to the second vertex by a second connecting edge.

4. The method of claim 1, wherein the portion of the low-density parity-check trapping set syndrome comprises two vertices, each of the two vertices connected to a non-zero edge, and the two vertices connected to each other by a non-zero connecting edge.

5. The method of claim 1, wherein the portion of the low-density parity-check trapping set syndrome comprises one vertex connected to two non-zero edges.

6. The method of claim 1, further comprising normalizing the low-density parity-check trapping set syndrome based on the correction.

7. The method of claim 6, further comprising unifying two or more trapping sets, wherein at least one of the one or more trapping sets is associated with the normalized low-density parity-check trapping set syndrome.

8. A method comprising:
   identifying one or more portions of a low-density parity-check near codeword;
   applying a correction to at least one or the one or more portions of the low-density parity-check near codeword; and
   applying an inverse transformation to the corrected near codeword to produce a valid codeword,
   wherein the correction is configured to reduce a number of unsatisfied check nodes in the low-density parity-check near codeword.

9. The method of claim 8, further comprising computing one or more values associated with the one or more portions of the low-density parity-check near codeword.

10. The method of claim 9, further comprising searching for the correction in a data structure based on the one or more values associated with the one or more portions of the low-density parity-check near codeword.

11. The method of claim 10, wherein the data structure is configured to store one or more trapping sets and corresponding corrections.

12. The method of claim 8, wherein at least one of the one or more portions of the low-density parity-check near codeword comprises one vertex connected to three non-zero edges.

13. The method of claim 8, wherein:
   the one or more portions of the low-density parity-check near codeword comprises three vertices;
   each of the three vertices connected to one non-zero edge;
   a first vertex of the three vertices is connected to a second vertex of the three vertices by a first connecting edge; and
   a third vertex of the three vertices is connected to the second vertex by a second connecting edge.

14. The method of claim 8, wherein the one or more portions of the low-density parity-check near codeword comprises two vertices, each of the two vertices connected to a non-zero edge, and the two vertices connected to each other by a non-zero connecting edge.

15. The method of claim 8, wherein the one or more portions of the low-density parity-check near codeword comprises one vertex connected to two non-zero edges.

16. A data communication system comprising:
   a processor;
   memory connected to the processor; and
   computer executable program code configured to execute on the processor,
   wherein the computer executable program code is configured to:
      identify one or more portions of a low-density parity-check near codeword;
      apply a correction to at least one or the one or more portions of the low-density parity-check near codeword; and
      applying an inverse transformation to the corrected near codeword to produce a valid codeword, wherein the correction is configured to reduce a number of unsatisfied check nodes in the low-density parity-check near codeword.

17. The system of claim 16, wherein at least one of the one or more portions of the low-density parity-check near codeword comprises one vertex connected to three non-zero edges.

18. The system of claim 16, wherein:
   the one or more portions of the low-density parity-check near codeword comprises three vertices;
   each of the three vertices connected to one non-zero edge;
   a first vertex of the three vertices is connected to a second vertex of the three vertices by a first connecting edge; and
   a third vertex of the three vertices is connected to the second vertex by a second connecting edge.

19. The system of claim 16, wherein the one or more portions of the low-density parity-check near codeword comprises two vertices, each of the two vertices connected to a non-zero edge, and the two vertices connected to each other by a non-zero connecting edge.

20. The system of claim 16, wherein the one or more portions of the low-density parity-check near codeword comprises one vertex connected to two non-zero edges.

* * * * *